United States Patent [19]
Levi

[11] Patent Number: 4,916,515
[45] Date of Patent: Apr. 10, 1990

[54] MICROWAVE CIRCUIT INTEGRATING

[76] Inventor: Clifford A. Levi, 20 Sylvan Rd., Woburn, Mass. 01801

[21] Appl. No.: 740,755

[22] Filed: Jun. 3, 1985

[51] Int. Cl.⁴ .................... H01L 23/48; H01L 29/44; H01L 29/60

[52] U.S. Cl. ...................................... 357/68; 357/69; 357/81

[58] Field of Search .................. 357/69, 81, 65, 67, 357/71, 68

[56] References Cited

U.S. PATENT DOCUMENTS

| | | | |
|---|---|---|---|
| 3,611,065 | 10/1971 | Zschauer | 357/81 X |
| 4,003,073 | 1/1977 | Helda et al. | 357/68 X |
| 4,115,837 | 9/1978 | Beall et al. | 357/81 X |
| 4,376,287 | 3/1983 | Sechi | 357/81 X |

OTHER PUBLICATIONS

Webster's Ninth New Collegiate Dictionary, 1983, p. 56.

Primary Examiner—Andrew J. James
Assistant Examiner—Sara W. Crane
Attorney, Agent, or Firm—Fish & Richardson

[57] ABSTRACT

A microwave integrated circuit includes a silicon chip having a pair of diffused junctions. A pair of gold leads 0.3 mils thick are in contact with respective ones of the diffused junctions depending from the chip parallel to the top surface of an alumina substrate 15 mils thick with an adhesive layer of an alumina-filled epoxy at most 0.1 mils thick between the beam leads and the substrate.

5 Claims, 2 Drawing Sheets

MICROWAVE CIRCUIT INTEGRATING

The present invention relates in general to microwave circuit integrating and more particularly concerns novel apparatus and techniques for providing an integrated microwave circuit element that may perform the functions of microstrip assemblies of transmission lines and discrete components bonded to suitable substrates while reducing assembly costs, simplifying assembly and providing improved thermal and other characteristics.

The typical prior art approach for microwave integrated circuits involves depositing a conductive layer on a suitable substrate, etching the conductive layer to define a pattern of transmission lines, bonding pads and other elements and then bonding active and passive discrete devices to form the circuit. This assembly is then typically enclosed in a suitable housing with appropriate bonds made to the outside connectors. The assembly is then tested. Often, discrete components are damaged in assembly. If any of the discrete components are defective, they must be removed and replaced, significantly adding to the cost of production and introducing undesired delay.

A search of the prior art in subclasses 60, 80 and 81 of class 357 uncovered U.S. Pat. Nos. 3,666,588, 4,003,073, 4,007,479, 4,028,722, 4,099,200, 4,115,837, 4,376,287, 4,411,719, British Patent No. 1 401 655 and Japanese patent document 105085.

It is an important object of the invention to provide an improved integrated microwave circuit element and method of manufacture.

According to the invention, there is a substrate, typically aluminum oxide, with first and second leads parallel to and adhered to the substrate top surface in spaced end-to-end relationship. A semiconductor chip is seated on the leads having first and second diffused junctions near the first and second lead ends, respectively, for establishing rectifying contact therewith. Preferably the bottom surface of the chip about the diffused junctions carries oxide or oxide-nitride passivation. Preferably, the leads and the chip region therebetween are fastened to the substrate by an adhesive layer, preferably electrically insulating of good thermal conductivity, such as aluminum-oxide-filled epoxy.

According to the process of the invention, a circuit is fabricated on a silicon wafer by standard beam-lead technology. Typically, a masking, passivating thermal oxide layer is grown. Windows are photo-defined in the oxide layer, and the anode and cathode of the diodes are diffused in. Contact windows are cut in the resulting oxide, and the contacts are coated with platinum. A silicide is formed to reduce the contact resistance. A metal layer is then deposited, and a pattern of contacts and transmission lines is defined in photo resist. The lines so defined are then plated-with gold to a thickness of 8–10 micrometers. The photo resist is removed, and the excess metal etched away. These processing operations just described are identical to those used to produce Alpha type DSG 6470-74 commercially available standard beam-lead PIN diodes.

The silicon wafer thus produced is bonded to one surface of an alumina substrate, typically 10–15 mils in thickness. An epoxy resin, filled with alumina powder is preferably the adhesive used for the bonding. The assembly is then pressed in a hydraulic press before curing of the epoxy to reduce the adhesive thickness as much as practical. The resulting layer is typically of the order of two micrometers under the gold beam leads.

After curing the epoxy, the thickness of the silicon is reduced to about 2 mils. A pattern to remove excess silicon is then photo-defined, using alignment to alignment grids etched into the silicon. The excess silicon is then etched away, and the individual circuits separated by sawing through the substrate.

Numerous other features, objects and advantages of the invention will become aparent from the following specification when read in connection with the accompanying drawing in which.

Figure 1:
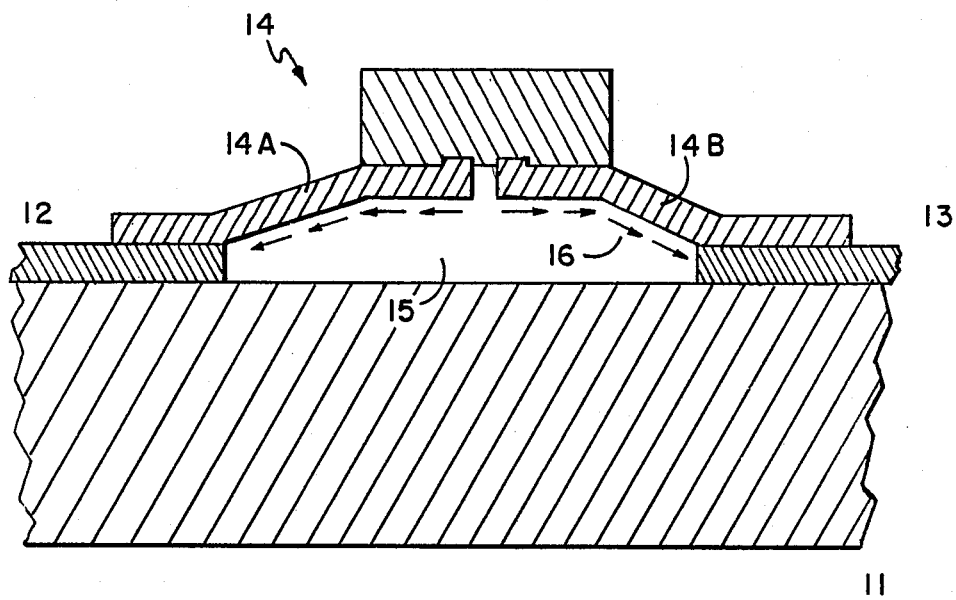
FIG. 1 is a sectional view of a fragmentary portion of a prior art microstrip assembly.

With reference now to the drawing, and more particularly FIG. 1 thereof, there is shown a fragmentary view of a prior art microstrip assembly. A substrate 11 supports microstrip conductors, such as 12 and 13. A silicon chip discrete beam lead diode 14 has beam leads 14A and 14B bonded to conductors 12 and 13, respectively. Note that there exists a significant air gap 15 between beam leads 14A, 14B and substrate 11. Heat flow from discrete diode 14 is therefore generally is indicated by arrows 16 along the length of beam leads 14A and 14B.

Figure 2:
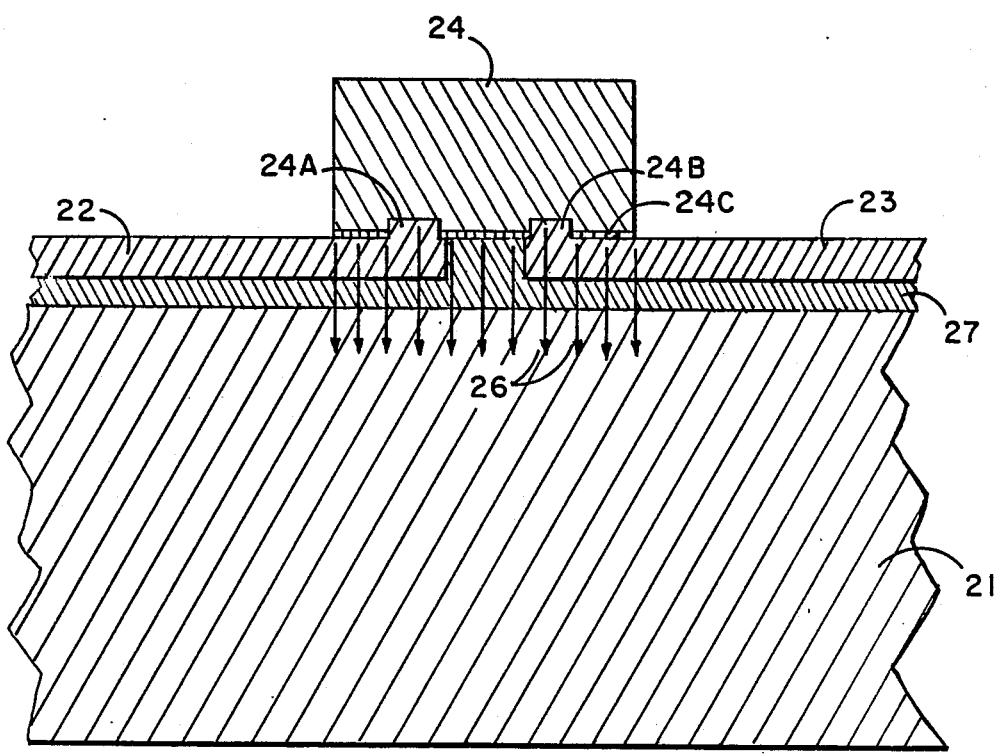
FIG. 2 is a fragmentary view of an embodiment of the invention with the gold leads bonded to the substrate carrying the silicon chip.

Referring to FIG. 2, there is shown a fragmentary view of a microwave integrated circuit element according to the invention. A substrate 21, typically aluminum oxide 15 mils thick, supports conductors 22 and 23 which form transmission lines or other circuit elements and silicon chip 24 bonded thereto by an adhesive layer 27, typically aluminum oxide filled epoxy having a maximum thickness between the leads and the top surface of substrate 21 of 0.1 mils and of additional thickness corresponding substantially to the thickness of leads 22 and 23 (typically 0.3 mils thick) between the top surface of substrate 21 and the bottom surface of chip 21. The bottom surface is plated, preferably with gold to define a ground plane. Silicon chip 24 is formed with diffused junctions 24A and 24B contacting leads 22 and 23, respectively. With this structural arrangement having leads 22 and 23 bonded to and closely adjacent to the top surface of substrate 21, the heat flow from silicon chip 24 is essentially normal to the top surface of substrate 21 and the bottom surface of silicon chip 24. Typically there is a layer of silicon oxide 24C along the bottom surface of chip 24 to provide oxide passivation. The heat flow is indicated by arrows, such as 26.

A simple embodiment of the invention comprises diodes and transmission lines. Other components, such as resistors, capacitors, transistors or inductors may be formed within the principles of the invention.

Typically, the circuit is fabricated on a silicon wafer using standard beam lead technology. In a specific example, a masking, passivating thermal oxide layer is grown, such as oxide layer 24C. Windows are photo-defined in the oxide, and the anode and cathode of the diodes are diffused in, typically forming junctions 24A and 24B. Contact windows are cut in the resulting oxide after diffusion, the contacts are coated with platinum and a silicide is formed to reduce the contact resistance. A metal layer is then deposited, and a pattern of contacts and transmission lines is defined in photoresist.

The lines so defined are then plated with gold to a thickness of 8–10 micrometers. The photoresist is then removed, and the excess metal etched away. The process thus described corresponds to that used to produce standard beam lead pin diodes, such as the Alpha type DSG 6470 PIN diode. The silicon wafer thus formed is bonded to the surface of substrate 21 with an epoxy resin filled with alumina powder, such as adhesive layer 27. This assembly is then pressed in a hydraulic press before curing of the epoxy to reduce the adhesive thickness as much as practical. The resulting layer is typically of the order of 2 micrometers under leads 22, 23.

After curing the epoxy layer, such as 27, the thickness of the silicon chip, such as 24, is reduced to about 2 mils. A pattern to remove excess silicon is photodefined. Since the alumina substrate is not transparent to infrared, the silicon is etched away at the edges, thereby exposing the metalization pattern to serve for registration of the mask. Alternately registration patterns previously etched in the silicon may be used. The excess silicon is then etched away, and the individual circuits are separated by sawing through the substrate. After separation, or preferably before separation, the circuits may be tested, and the rejects identified with suitable probing equipment. It is possible to characterize both the D.C. and the microwave performance of the circuits, something not possible with discrete devices.

Figure 3:
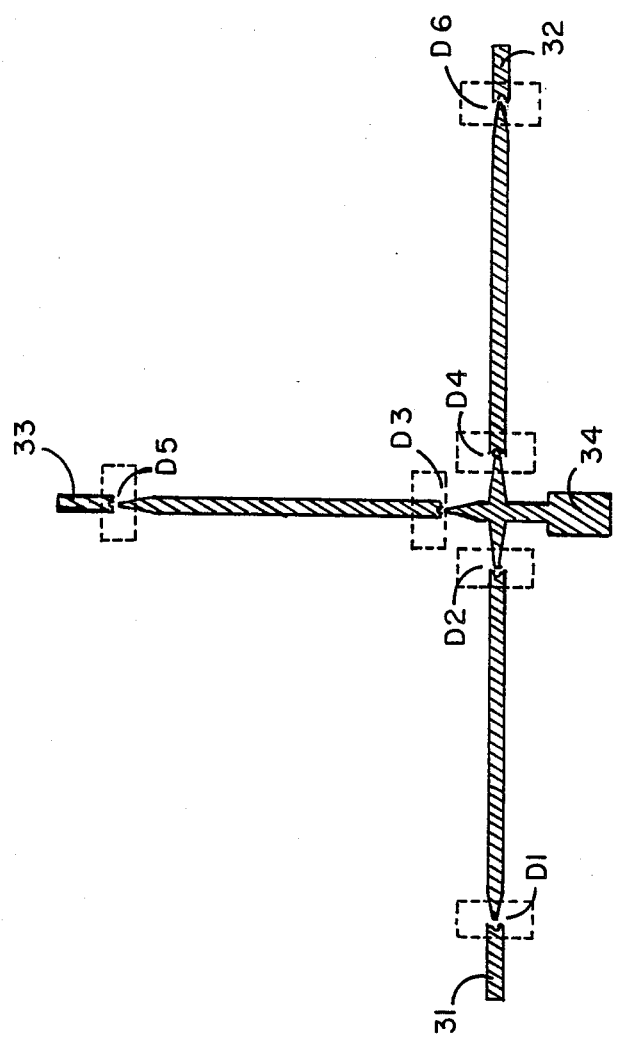
FIG. 3 shows the conductor pattern on the surface of a wafer in a circuit embodying the invention.

Referring to FIG. 3, there is shown a magnified plan view defining the pattern of conductors applied to the surface of the silicon wafer which is then in turn applied to the alumina substrate in an actual circuit embodying the invention. Broken lines embrace active silicon devices D1, D2, D3, D4, D5 and D6 that are allowed to remain. The silicon is removed from all other areas in the plan of the conductors represented by the hatched areas. In this embodiment the surface of FIG. 3 overlays the aluminum oxide substrate with conducting portions 31 and 32 engaging respective leads on the substrate, such as 22 and 23, in FIG. 2 and conducting portions 33 and 34 engage a similar pair of leads oriented typically perpendicular to the leads engaging conducting portions 31 and 32. Numerous other circuit configurations may be embodied within the principles of the invention.

There has been described novel microwave integrated circuit structures and processes of manufacture having a number of advantages. The invention may replace conventional microstrip assemblies of transmission lines and discrete components bonded upon substrates to reduce assembly costs and simplify assembly. The invention may be embodied in other devices, such as beam lead transistors and capacitbrs. The elements may be pretested and fully characterized before assembly, thereby reducing rework costs. The invention is characterized by improved heat sinking to the active circuit elements, thereby improving their power handling capability, reducing their operating temperature and increasing their reliability. The invention reduces the failure of bonded beam-lead devices by avoiding the flexing of leads caused by thermal expansion and contraction under pulse conditions and in the presence of mechanical shock.

It is evident that those skilled in the art may now make numerous uses and modifications of and departures from the specific apparatus and techniques disclosed herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. A microwave integrated circuit comprising,
   an insulating substrate,
   a semiconductor chip having at least a rectifying junction formed therein in contact with a first lead comprising a transmission line,
   said first lead being bonded to the surface of said substrate substantially parallel thereto and separated therefrom by an adhesive layer of thickness less than that of said first lead for establishing a heat flow between said junction through said first lead to said substrate essentially normal to the plane of said substrate through said first lead and said adhesive layer,
   said adhesive layer being an electrically insulating layer of good thermal conductivity.

2. A microwave integrated circuit in accordance with claim 1 and further comprising at least a second rectifying junction formed in said chip with at least a second lead comprising a transmission line connected thereto substantially coplanar with said first lead and bonded to said substrate.

3. A microwave integrated circuit in accordance with claim 1 wherein said adhesive layer is an alumina-filled epoxy.

4. A microwave integrated circuit in accordance with claim 2 wherein said adhesive layer is an alumina-filled epoxy.

5. A microwave integrated circuit in accordance with claim 3 wherein said substrate is alumina substantially 15 mils thick,
   said first lead is gold substantially 0.3 mils thick,
   and said adhesive layer is substantially 0.1 mil thick in the region between said first lead and said substrate.

* * * * *

UNITED STATES PATENT AND TRADEMARK OFFICE
CERTIFICATE OF CORRECTION

PATENT NO. : 4,916,515
DATED : April 10, 1990
INVENTOR(S) : Clifford A. Levi

It is certified that error appears in the above-identified patent and that said Letters Patent is hereby corrected as shown below:

Column 1, line 56, spell "photo-resist" correctly.

Column 2, line 14, change "." to --;--.

Column 2, line 17, change "," to --;--.

Column 3, line 51, spell "capicitors" correctly.

Column 4, line 51, after "is" delete "."

Signed and Sealed this

Seventh Day of April, 1992

Attest:

HARRY F. MANBECK, JR.

*Attesting Officer*      Commissioner of Patents and Trademarks